(12) United States Patent
Lee et al.

(10) Patent No.: US 9,743,015 B2
(45) Date of Patent: Aug. 22, 2017

(54) IMAGE CAPTURING APPARATUS AND METHOD OF CONTROLLING THE SAME

(71) Applicant: SAMSUNG ELECTRONICS CO., LTD., Suwon-si, Gyeonggi-do (KR)

(72) Inventors: Tae-hee Lee, Suwon-si (KR); Chong-sam Chung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/057,201

(22) Filed: Mar. 1, 2016

(65) Prior Publication Data
US 2016/0344943 A1 Nov. 24, 2016

Related U.S. Application Data

(60) Provisional application No. 62/165,494, filed on May 22, 2015.

(30) Foreign Application Priority Data

Jul. 10, 2015 (KR) ........................ 10-2015-0098414

(51) Int. Cl.
H04N 5/247 (2006.01)
H04N 9/04 (2006.01)
H04N 5/232 (2006.01)
H04N 5/265 (2006.01)
H04N 5/225 (2006.01)
H01L 27/146 (2006.01)

(52) U.S. Cl.
CPC ....... *H04N 5/247* (2013.01); *H01L 27/14607* (2013.01); *H04N 5/2257* (2013.01); *H04N 5/23229* (2013.01); *H04N 5/23235* (2013.01); *H04N 5/265* (2013.01); *H04N 9/045* (2013.01)

(58) Field of Classification Search
CPC ........ H04N 9/045; H04N 9/09; H04N 5/3696; H04N 5/2258; H04N 5/265; H04N 5/23229; H04N 5/23232; H04N 5/2355; H04N 5/347; H04N 5/35563; H04N 5/35581; H04N 5/35554; H04N 13/0239; G03B 35/08; H01L 27/14607; H01L 27/14605; H01L 27/14603; H01L 27/14601

See application file for complete search history.

(56) References Cited

U.S. PATENT DOCUMENTS

| 8,681,250 | B2 | 3/2014 | Culbert et al. | |
| 8,704,942 | B2* | 4/2014 | Shimoda | H04N 5/23212 348/280 |
| 9,294,756 | B2* | 3/2016 | Yamazaki | H04N 13/0239 |
| 9,319,585 | B1* | 4/2016 | Liu | H04N 9/07 |

(Continued)

*Primary Examiner* — Michael Osinski
(74) *Attorney, Agent, or Firm* — Nixon & Vanderhye, P.C.

(57) ABSTRACT

An image capturing apparatus is provided, including: a first camera module and a second camera module configured to capture an image of a same subject; and a controller configured to map a second image obtained from the second camera module to a first image obtained from the first camera module, and to synthesize a third image of the subject using the first image and the mapped second image, wherein an image sensor included in the first camera module has a first pixel structure in which a pixel has a square shape, and an image sensor included in the second camera module has a second pixel structure that is different from the first pixel structure.

13 Claims, 16 Drawing Sheets

(56) References Cited

U.S. PATENT DOCUMENTS

| | | | |
|---|---|---|---|
| 2004/0090550 A1* | 5/2004 | Park | H04N 9/045 348/350 |
| 2005/0128509 A1* | 6/2005 | Tokkonen | H04N 9/045 358/1.15 |
| 2007/0070225 A1* | 3/2007 | Sei | H04N 9/093 348/273 |
| 2007/0153104 A1* | 7/2007 | Ellis-Monaghan | H04N 9/045 348/272 |
| 2009/0059051 A1* | 3/2009 | Sakamoto | H04N 5/235 348/311 |
| 2010/0309351 A1* | 12/2010 | Smith | H04N 5/335 348/280 |
| 2011/0273599 A1* | 11/2011 | Murata | G02B 7/36 348/294 |
| 2012/0212662 A1* | 8/2012 | Shimoda | H04N 5/23212 348/349 |
| 2013/0120644 A1* | 5/2013 | Fujii | G02B 7/36 348/349 |
| 2013/0215238 A1* | 8/2013 | Yamazaki | H04N 13/0239 348/49 |
| 2014/0176785 A1* | 6/2014 | Sambonsugi | H04N 5/23212 348/350 |
| 2014/0307140 A1* | 10/2014 | Hayashi | H04N 9/07 348/281 |
| 2014/0368618 A1* | 12/2014 | Ushinaga | G03B 35/08 348/49 |
| 2014/0375673 A1* | 12/2014 | Ishiga | H04N 5/3696 345/591 |
| 2015/0130010 A1* | 5/2015 | Li | H01L 27/14607 257/443 |
| 2015/0146054 A1* | 5/2015 | Vaartstra | H04N 5/3696 348/280 |
| 2015/0256734 A1* | 9/2015 | Fukuhara | H04N 5/2355 348/294 |
| 2015/0319412 A1* | 11/2015 | Koshiba | H04N 5/367 348/246 |
| 2015/0358593 A1* | 12/2015 | Sato | H04N 9/045 348/280 |
| 2016/0037152 A1* | 2/2016 | Kim | G06T 7/593 348/47 |
| 2016/0227138 A1* | 8/2016 | Kozlowski | H04N 5/35563 |
| 2016/0284759 A1* | 9/2016 | Kimura | H01L 27/14643 |

* cited by examiner

IMAGE CAPTURING APPARATUS AND METHOD OF CONTROLLING THE SAME

CROSS-REFERENCE TO RELATED APPLICATION

This application is based on and claims priority under 35 U.S.C. §119 to U.S. Provisional Application No. 62/165,494, filed on May 22, 2015, and Korean Patent Application No. 10-2015-0098414, filed on Jul. 10, 2015, in the Korean Intellectual Property Office, the disclosures of which are incorporated by reference herein in their entireties.

BACKGROUND

1. Field

The present disclosure relates generally to image capturing apparatuses and methods of operating the same, and for example, to image capturing apparatuses improving an image resolution using images acquired from a plurality of camera modules and methods of operating the image capturing apparatuses.

2. Description of Related Art

A multi-camera system includes two or more camera modules, and may detect a focus on a predetermined object or a stereoscopic image of the object by using images respectively input to the camera modules. Also, the multi-camera system has recently been used in obtaining a plurality of pieces of image information to improve an image resolution.

SUMMARY

Image capturing apparatuses are provided for improving an image resolution using images obtained from a first camera module and a second camera module whose respective image sensors have different pixel forms, and methods of operating the same.

Additional aspects will be set forth in part in the description which follows and, in part, will be apparent from the description.

According to an aspect of an example embodiment, an image capturing apparatus includes: a first camera module comprising a camera and a second camera module comprising a camera, the first and second camera modules configured to capture an image of a same subject; and a controller configured to map a second image obtained from the second camera module to a first image obtained from the first camera module, and to synthesize a third image of the subject using the first image and the mapped second image, wherein an image sensor included in the first camera module has a first pixel structure in which a pixel has a square shape, and an image sensor included in the second camera module has a second pixel structure that is different from the first pixel structure.

One of the first and second camera modules may be a color camera module, and the other of the first and second camera modules may be a monochromatic camera module.

The image sensor of the second camera module includes a plurality of pixel structures. At least one of a size and a shape of a first region of the plurality of pixel structures of the second camera module image sensor and a second region of the plurality of pixel structures of the second camera module image sensor included in the second pixel structure may be different from each other.

The controller may be configured to select, based on parallax information between the first image and the mapped second image, an image obtained from the color camera module or an image obtained from the monochromatic camera module, as a reference image for image synthesis.

The controller may be configured to determine whether a value of the parallax information is greater than a threshold value, and when the value of the parallax information is greater than the threshold value, an image obtained from the color camera module may be determined to be the reference image for image synthesis, and when the value of the parallax information is not greater than the threshold value, an image obtained from the monochromatic camera module may be determined to be the reference image for image synthesis.

The parallax information may include at least one of disparity information and occlusion information of the first image and the mapped second image.

According to an aspect of another example embodiment, a method of operating an image capturing apparatus, includes: obtaining a first image of a subject from a first camera module and a second image of the subject from a second camera module; mapping the second image to the first image; and synthesizing a third image of the subject using the first image and the mapped second image, wherein an image sensor included in the first camera module has a first pixel structure in which a pixel has a square shape, and an image sensor included in the second camera module has a second pixel structure that is different from the first pixel structure.

One of the first and second camera modules may be a color camera module, and the other of the first and second camera modules may be a monochromatic camera module.

At least one of a size and a shape of a first region and a second region of a plurality of pixel structures included in the second pixel structure of the image sensor of the second camera module may be different from each other.

The synthesizing of the third image of the subject may include selecting, based on parallax information between the first image and the mapped second image, an image obtained from the color camera module or an image obtained from the monochromatic camera module, as a reference image for image synthesis.

The synthesizing of the third image of the subject may include determining whether the value of the parallax information is greater than a threshold value, wherein when the value of the parallax information is greater than the threshold value, an image obtained from the color camera module is determined to be the reference image for image synthesis, and when the value indicated by the parallax information is not greater than the threshold value, an image obtained from the monochromatic camera module is determined to be the reference image for image synthesis.

The parallax information may include at least one of disparity information and occlusion information of the first image and the mapped second image.

According to an aspect of another example embodiment, a non-transitory computer readable medium having embodied thereon a program for executing the method above is provided.

BRIEF DESCRIPTION OF THE DRAWINGS

These and/or other aspects will become apparent and more readily appreciated from the following detailed description, taken in conjunction with the accompanying drawings, in which like reference numerals refer to like elements, and wherein.

DETAILED DESCRIPTION

Figure 1:
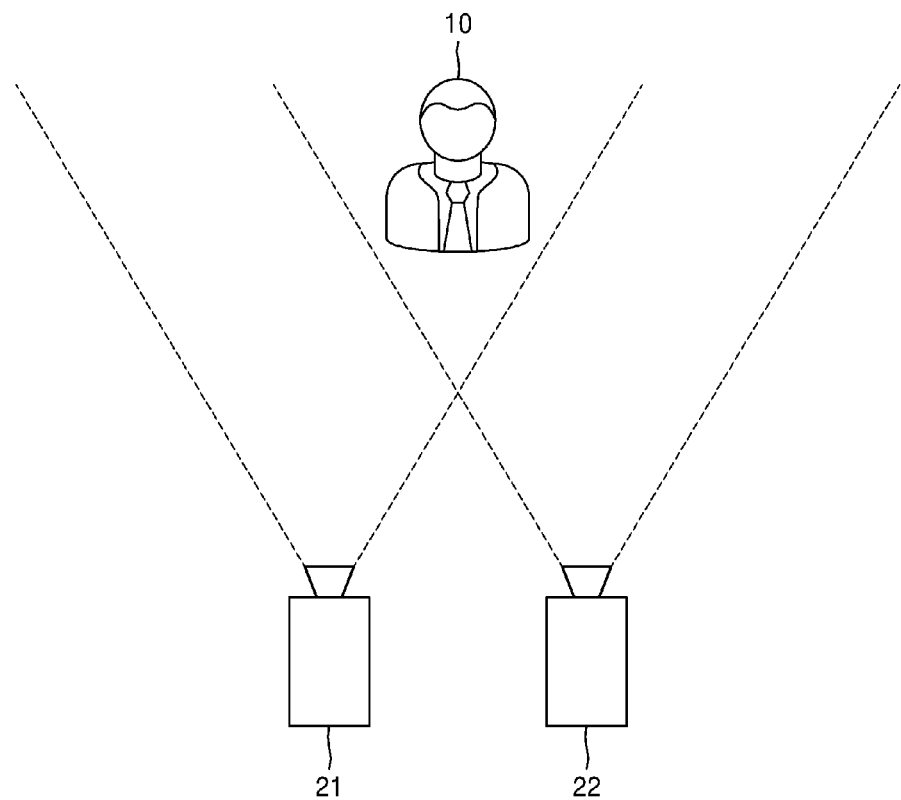
FIG. 1 is a diagram illustrating an example multi-camera system including a plurality of camera modules.

Reference will now be made in greater detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are simply described below, by referring to the figures, to explain aspects of the disclosure.

The terms used in the present disclosure will be described briefly and example embodiments will then be described in greater detail.

The terms used in the present disclosure are those general terms currently widely used in the art in consideration of functions in regard to the example embodiments, but the terms may vary based on the intention of those of ordinary skill in the art, precedents, or new technology in the art. Also, specified terms may be arbitrarily selected, and in this case, the detailed meaning thereof will be described in the detailed description. Thus, the terms used in the present disclosure should be understood not as simple names but based on the meaning of the terms and the overall description.

Throughout the disclosure, it will be understood when a part "includes" an element, unless there is a particular description contrary thereto, the part can further include other elements, not excluding the elements. Also, the terms "unit" and "module" used herein represent a unit for processing at least one function or operation, which may be implemented by hardware (e.g., hardware circuitry), firmware, software, or a combination of hardware and software.

The example embodiments will be described with reference to the accompanying drawings in such a manner that the example embodiments may be readily understood by a person of ordinary skill in the art. However, the disclosure may be implemented in various forms and is not limited to the example embodiments. In addition, descriptions regarding portions unrelated to the disclosure may be omitted for clarity and conciseness, and similar reference numerals are assigned to similar elements throughout the disclosure. As used herein, the term "and/or" includes any and all combinations of one or more of the associated listed items. Expressions such as "at least one of," when preceding a list of elements, may modify the entire list of elements and does not necessarily modify the individual elements of the list.

FIG. 1 is a diagram illustrating a multi-camera system including a plurality of camera modules.

The multi-camera system may, for example, be a stereoscopic camera generating a stereoscopic image. The multi-camera system may include, for example, a first camera module 21 and a second camera module 22 capturing an image of a same subject 10. The first camera module 21 and the second camera module 22 may be spaced apart from each other by a predetermined distance. The multi-camera system may obtain a third image using a first image obtained from the first camera module 21 and a second image obtained from the second camera module 22.

Figure 2:
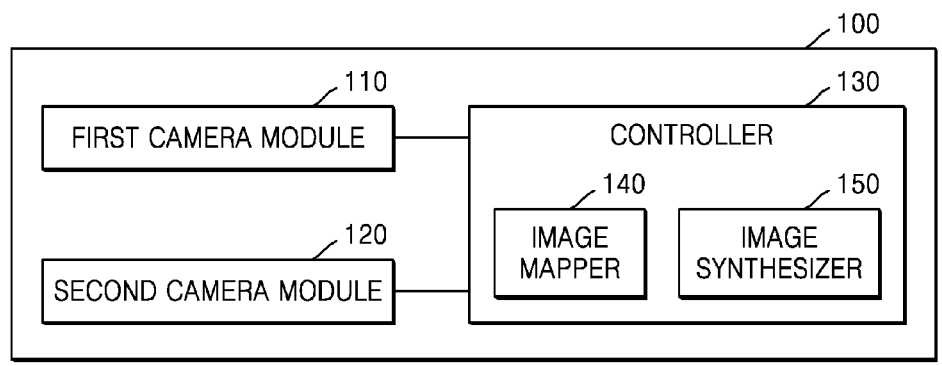
FIG. 2 is a structural block diagram illustrating an example image capturing apparatus.

FIG. 2 is a block diagram illustrating an example image capturing apparatus 100.

Referring to FIG. 2, the image capturing apparatus 100 may include, for example, a first camera module (e.g., including a camera and an image sensor) 110, a second camera module (e.g., including a camera and an image sensor) 120, and a controller (e.g., including processing circuitry in the form of hardware circuitry and/or firmware implementing software) 130. The image display apparatus 100 may be implemented as a multi-camera system including a plurality of camera modules described with reference to FIG. 1. The image capturing apparatus 100 may be implemented in various forms such as a digital still camera capturing a still image or a digital video camera capturing video images. In addition, the image capturing apparatus 100 may include a digital single lens reflex (DSLR) camera, a mirrorless camera, a smart phone or the like. However, the image capturing apparatus 100 is not limited thereto, and the image capturing apparatus 100 according to an example embodiment may include a device including a plurality of camera modules capable of capturing an image of a subject, such as a lens and an image pickup device. In addition, the controller 130 according to an example embodiment may include an image mapper (e.g., including image mapping circuitry) 140 and an image synthesizer (e.g., including image synthesizing circuitry) 150.

According to an example embodiment, an image sensor included in the first camera module 110 and an image sensor included in the second camera module 120 may have different pixel structures. For example, the image sensor included in the first camera module 110 may have a first pixel structure including square-shaped pixels, and the image sensor included in the second camera module 120 may have a second pixel structure different from the first pixel structure. A pixel structure may, for example, refer to a form of pixels included in an image sensor of a camera module, and pixels of different forms may receive different amounts of light when capturing an image. For example, a pixel having a large pixel size may be used to produce an image of high sensitivity or high luminance compared to a pixel having a small pixel size. A pixel having a small pixel size may be used to produce an image of low sensitivity or low luminance compared to a pixel having a large pixel size under the same conditions. A high dynamic range (HDR) image may be obtained using pixel structures of different pixel sizes. In addition, a color reproduction rate of a color camera module may vary based on a difference in the form of pixels.

According to an example embodiment, a first pixel structure may, for example, have a typical pixel structure of a rectangular shape or a square shape, and a second pixel structure may have a polygonal structure different from the first pixel structure.

In addition, according to an example embodiment, a resolution of an image sensor included in the first camera module 110 may be different from that of an image sensor included in the second camera module 120. A resolution of an image sensor may, for example, be determined based on the number of pixels included in the image sensor. The higher the number of pixels included in an image sensor, the higher is a resolution of the image sensor. For example, a resolution of the image sensor of the first camera module 110 may be lower than that of the image sensor of the second camera module 120. A resolution of the image sensor of the second camera module 120 may be higher than that of the image sensor of the first camera module 110.

According to an example embodiment, a first camera module may be a color camera module, and a second camera module may be a monochromatic camera module. According to another example embodiment, a first camera module may be a monochromatic camera module, and a second camera module may be a color camera module. Generally, a color image provides color information compared to a monochromatic image, and a monochromatic image provides detail information compared to a color image since the monochromatic image is formed by absorbing more light. When a color camera module and a monochromatic camera module are used at the same time, the effects of a color image and a monochromatic image may be obtained at the same time.

The controller 130 may be configured to control an overall operation of the image capturing apparatus 100. The controller 130 may be configured to provide a control signal for operating each element included in the image capturing apparatus 100.

The controller 130 may be configured to process an input image signal and to control each element based on the input image signal or an external input signal. The controller 130 may, for example, correspond to one or more processors. The one or more processors may be implemented by processing circuitry including an array of a plurality of logic gates, or may be implemented by a combination of a general-purpose microprocessor and a memory that stores a program executable in the general-purpose microprocessor. In addition, it will be apparent to a person of ordinary skill in the art that the one or more processors may be implemented using other types of hardware.

The controller 130 may be configured to generate a control signal for controlling autofocusing, zoom change, focus change, auto-exposure correction or the like by performing a stored program or including an additional module to provide the control signal to an aperture driver, a lens driver, and an image sensor controller included in each of the first camera module 110 and the second camera module 120, and may be configured to control an overall operation of each element included in the image capturing apparatus 100, such as, for example, a shutter or a strobe.

The controller 130 may be connected to an external monitor and be configured to perform predetermined image signal processing on an image signal received from an image signal processor included in the first camera module 110 or the second camera module 120, so that the image signal is displayed on an external monitor, and may be configured to transmit processed image data to the external monitor to display the image on the external monitor.

According to an example embodiment, the image mapper 140 may map a second image obtained from the second camera module 120 to a first image obtained from the first camera module 110. For example, the image mapper 140 may map a pixel of the second image to a pixel of the first image using pixels of the second image adjacent to the pixel of the second image corresponding to the pixel of the first image.

According to an example embodiment, the image synthesizer 150 may synthesize a third image of a subject using parallax information between the first image and the mapped second image. The image synthesizer 150 according to an example embodiment may, for example, select an image obtained from a color camera module or an image obtained from a monochromatic camera module as a reference image for image synthesis, based on parallax information between the first image and the mapped second image.

In addition, the image synthesizer 150 according to an example embodiment may determine whether a value of the parallax information is greater than a threshold value, and when the value of the parallax information is greater than a threshold value, the image synthesizer 150 may determine an image obtained from a color camera module as a reference image for image synthesis, and when the value of the parallax information is not greater than a threshold value, the image synthesizer 150 may determine an image obtained from a monochromatic camera module as a reference image for image synthesis.

In addition, the image synthesizer 150 may synthesize a third image of a subject using at least one of disparity information and occlusion information of the first image and the mapped second image.

According to an example embodiment, a third image may be synthesized based on a color image or a monochromatic image. When synthesizing a third image based on a color image, color information may be maintained without change, and thus color reproduction of the color image may be secured, and improved detailed information of a monochromatic image may also be obtained. When a third image is synthesized based on a monochromatic image, detail information of the mono image may be maintained without change, and thus a resolution and a signal to noise ratio (SNR) of the monochromatic image may be secured, and color information of a color image may be used.

Figure 3:
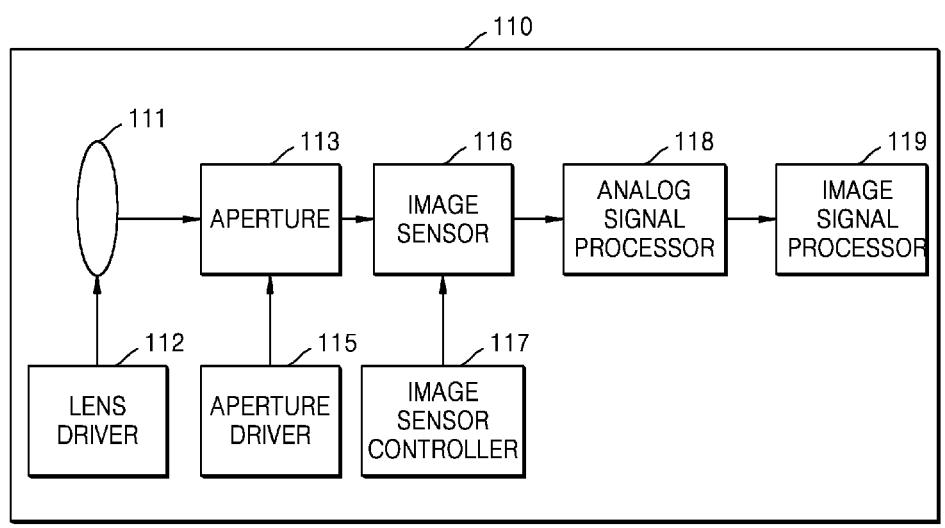
FIG. 3 is a structural block diagram illustrating an example of a first camera module of FIG. 2.

FIG. 3 is a block diagram illustrating an example of the first camera module 110 of FIG. 2.

Referring to FIG. 3, the first camera module 110 may include, for example, a lens 111, a lens driver 112, an aperture 113, an aperture driver 115, an image sensor 116, an image sensor controller 117, and an analog signal processor 118, and an image signal processor 119.

The lens 111 may include a plurality of lens groups each including a plurality of lenses. A location of the lens 111 may be adjusted using the lens driver 112. The lens driver 112 may adjust the location of the lens 111 based on a control signal provided by the controller 130. The lens driver 112 may adjust a focal length by adjusting the location of the lens 111 and may also perform auto-focusing, zoom adjustment, focus adjustment, or the like.

The aperture driver 115 may adjust a degree of opening of the aperture 113 to adjust an amount of light incident on the image sensor 116.

An optical signal, which has passed through the lens 111 and the aperture 113, may form an image of a subject on a light-receiving surface of the image sensor 116. The image sensor 116 may, for example, be a charge-coupled device (CCD) image sensor or a complementary metal-oxide semiconductor image sensor (CIS), or the like, configured to convert an optical signal into an electrical signal. The image sensor controller 117 may adjust the sensitivity or the like of the image sensor 116. The image sensor controller 117 may control the image sensor 116 based on a control signal. The control signal may be automatically generated by an image signal that is input in real time or may be manually input by, for example, a user operation.

The analog signal processor 118 may, for example, perform noise reduction, gain control, waveform shaping, and analog-to-digital conversion (ADC) on an analog signal provided from the image sensor 116.

The image signal processor 119 may perform a specific function on an image data signal obtained by processing in the analog signal processor 118. For example, for image quality enhancement and special effects, the image signal processor 119 may perform image signal processing, such as noise reduction, gamma correction, color filter array interpolation, color matrix, color correction, and color enhancement, white balancing, luminance smoothing, and color shading, or the like, with respect to the input image data signal. The image signal processor 119 may compress the input image data into an image file, or may reconstruct the image data from the image file. An image compression format may be reversible or irreversible. For example, a still image may be compressed into a Joint Photographic Experts Group (JPEG) format or a JPEG 2000 format. In the case of recording a video, a plurality of frames may be compressed into a video file in accordance with the Moving Picture Experts Group (MPEG) standard. For example, an image file may be generated in accordance with the exchangeable image file format (Exif) standard.

The image signal processor 119 may generate a video file from an imaging signal generated by the image sensor 116. The imaging signal may be a signal that is generated by the image sensor 116 and is then processed by the analog signal processor 118. The image signal processor 119 may generate frames to be included in a video file from an imaging signal, code the frames in accordance with an appropriate standard, for example, MPEG4, H.264/AVC, or windows media video (WMV), or the like, to compress a video, and generate a video file by using the compressed video. The video file may be generated in various formats, such as mpg, mp4, 3gpp, avi, asf, or mov. The image signal processor 119 may output a generated first image to the controller 130.

In addition, the image signal processor 119 may perform sharpness processing, chromatic processing, blurring processing, edge emphasis processing, image interpretation processing, image recognition processing, image effect processing, and the like on the input image data. The image recognition processing may include face recognition processing and scene recognition processing. The image signal processor 119 may perform image signal processing to display image data on a display panel of a display unit. For example, the image signal processor 119 may perform luminance level adjustment, color correction, contrast adjustment, contour emphasis adjustment, screen splitting, character image generation, and image synthesis, or the like.

The second camera module 120 may also include, similarly to the first camera module 110, a lens, a lens driver, an aperture, an aperture driver, an image sensor, an image sensor controller, an analog signal processor, and an image signal processor. These elements are described above with reference to the first camera module 110, and thus description thereof will not be repeated.

Figure 4:
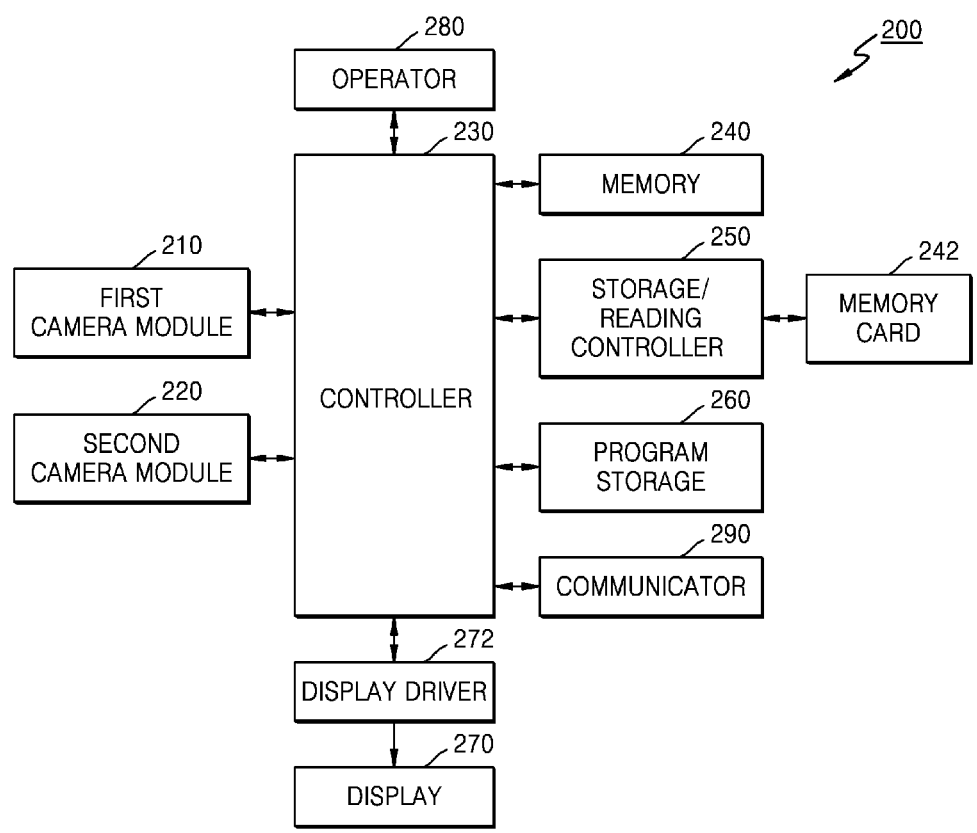
FIG. 4 is a structural block diagram illustrating an example image capturing apparatus.

FIG. 4 is a block diagram illustrating an example image capturing apparatus 200.

Referring to FIG. 4, the image capturing apparatus 200 may include, for example, a first camera module 210, a second camera module 220, a controller 230, a memory 240, a storage/reading controller 250, a memory card 242, a program storage 260, a display 270, a display driver 272, an operator (e.g., including operating circuitry for enabling various inputs for inputting various control signals) 280, and a communicator (e.g., including communication circuitry) 290.

The first camera module 210, the second camera module 220, and the controller 230 of FIG. 4 respectively correspond to the first camera module 110, the second camera module 120, and the controller 130 of FIG. 2, and thus description provided above and also applied to the example embodiment will be omitted, and description will focus on the other elements.

Referring to FIG. 4, the storage/reading controller 250 may store image data output from the first camera module 210 or the second camera module 220 in the memory card 242. The storage/reading controller 250 may store image data based on a signal transmitted by a user or automatically. In addition, the storage/reading controller 250 may read data about an image from an image file stored in the memory card 242, and input the data to the display driver 272 via the memory 240 or another path so that the image is displayed on the display 270.

The memory card 242 may be detachable or may be permanently mounted in the image capturing apparatus 200. For example, the memory card 242 may be a flash memory card such as a Secure Digital (SD) card, or the like.

A signal processed by the first camera module 210 or the second camera module 220 may be input to the controller 230 directly or via the memory 240. The memory 240 operates, for example, as a main memory of the image capturing apparatus 200, and temporarily stores information needed during an operation of the image capturing apparatus 200. The program storage 260 may store a program such as an operating system or an application system or the like that drives the image capturing apparatus 200.

The image capturing apparatus 200 may include the display (e.g., including display circuitry and a display panel) 270 to display an operating state of the image capturing apparatus 200 or image information obtained by image capturing performed by the image capturing apparatus 200. The first camera module 210 and the second camera module 220 may perform image signal processing to display image information obtained by image capturing, on the display 270. For example, the first camera module 210 and the second camera module 220 may perform luminance level adjustment, color correction, contrast adjustment, contour emphasis adjustment, screen splitting, character image generation, and image synthesis, or the like, on image information obtained by image capturing.

The display 270 may provide visual information to a user. The display 270 may include a liquid crystal display (LCD) panel, an organic light-emitting display panel or the like to provide visual information. The display 270 may be a touch screen whereby a touch input is recognized.

The display driver 272 provides a driving signal to the display 270.

The operator 280 may allow the user to input control signals. The operator 280 may include various function buttons, such as a shutter-release button configured to input a shutter-release signal for capturing an image by exposing the image sensor 116 to light for a predetermined period of time, a power button configured to input a control signal for controlling a power on/off state of the image capturing apparatus 200, a zoom button configured to widen or narrow an angle of view according to an input, a mode selection button, and other buttons configured to adjust image capturing setting values. The operator 280 may also be implemented in any form, such as a button, a keyboard, a touch pad, a touch screen, or a remote controller, as long as the operator 280 allows the user to input control signals.

The communicator 290 may include a network interface card (NIC), a modem or the like, and may allow the image capturing apparatus 200 to communicate with an external device via a network in a wired or wireless manner.

Meanwhile, FIGS. 2, 3, and 4 illustrating the image capturing apparatus 100 or 200 are merely examples. The elements of the image capturing apparatus 100 or 200 illustrated in the block diagrams of FIGS. 2, 3, and 4 may be integrated, or elements may be added to or omitted from the above according to specifications of the image capturing apparatus 100 or the image capturing apparatus 200 that is actually implemented. For example, when necessary, two or more elements may be integrated to a single element, or an element may be divided into two or more elements. In addition, functions performed by each block are provided to describe example embodiments, and an operation or an apparatus corresponding to the functions does not limit the scope of the disclosure.

Figure 5:
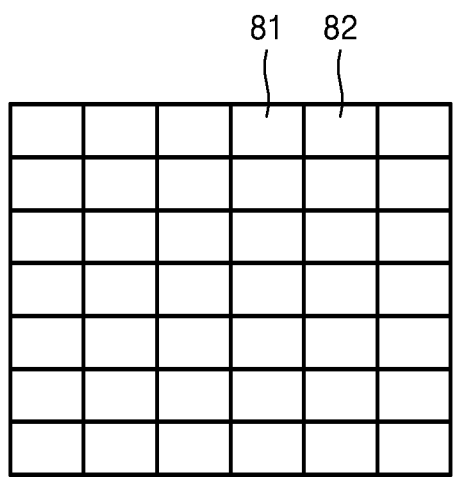
FIG. 5 is a diagram illustrating an example first pixel structure.
Figure 6A:
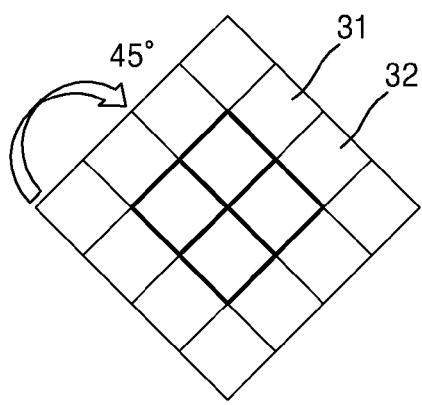
FIGS. 6A and 6B are diagrams illustrating an example second pixel structure.
Figure 6B:
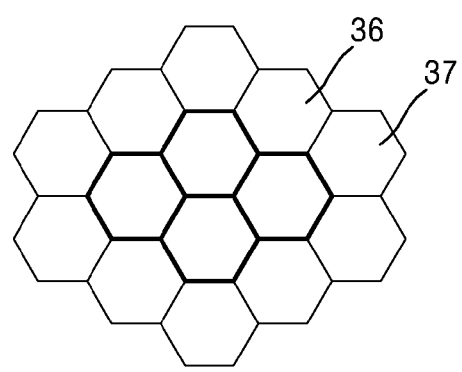
Figure 7A:
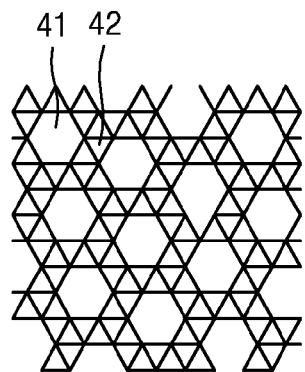
FIGS. 7A through 7D are diagrams illustrating example second pixel structures.
Figure 7B:
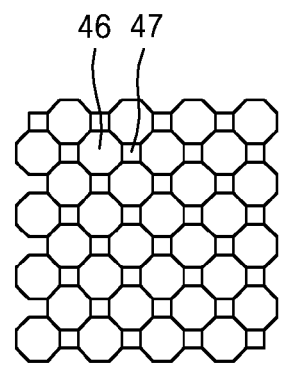
Figure 7C:
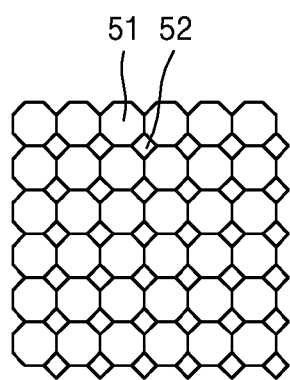
Figure 7D:
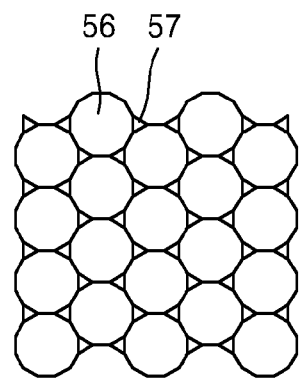

FIG. 5 is a diagram illustrating an example first pixel structure. FIGS. 6A and 6B are diagrams illustrating an example second pixel structure. FIGS. 7A through 7D are diagrams illustrating example second pixel structures.

According to an example embodiment, a first pixel structure may, for example, have a rectangular or square pixel structure of an image sensor of a typical camera module, and a second pixel structure may, for example, have a polygonal structure that is different from the first pixel structure.

FIG. 5 is a diagram illustrating an example first pixel structure. Referring to FIG. 5, pixels 81 and 82 of the first pixel structure are each rectangular and have an identical size.

FIGS. 6A and 6B are reference diagrams illustrating an example second pixel structure. FIG. 6A illustrates an example second pixel structure of an image sensor which is obtained after, for example, rotating an image sensor of a typical camera module by 45 degrees, and FIG. 6B illustrates a second pixel structure of an image sensor having a honeycomb shape. Referring to FIGS. 6A and 6B, the second pixel structures of FIGS. 6A and 6B have a different shape from that of the first pixel structure of FIG. 5. However, at least two pixels 31 and 32 of FIG. 6A have the same size and shape and at least two pixels 36 and 37 of FIG. 6B have the same size and shape.

FIGS. 7A through 7D are diagrams illustrating example second pixel structures. Referring to FIGS. 7A through 7D an image sensor of a camera module may have a second pixel structure in which at least two arbitrary pixels have different sizes and shapes from each other. For example, a second pixel structure of FIG. 7A may have a hexagonal pixel 41 and a triangular pixel 42; a second pixel structure of FIG. 7B may have an octagonal pixel 46 and a square pixel 47; a second pixel structure of FIG. 7C may have an octagonal pixel 51 and a square pixel 52 which is rotated by 45 degrees; and a second pixel structure of FIG. 7D may have a dodecagonal pixel 56 and a triangular pixel 57.

Figure 8A:
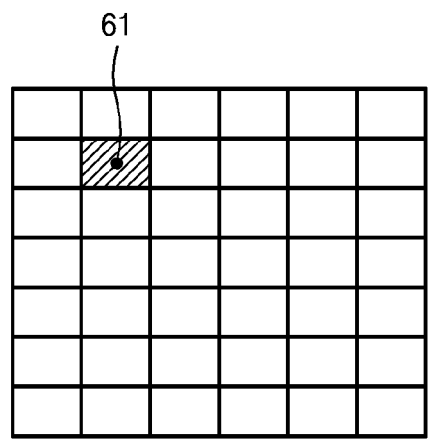
FIGS. 8A and 8B are diagrams illustrating an example method of obtaining a second image mapped to a first image using an image mapper.
Figure 8B:
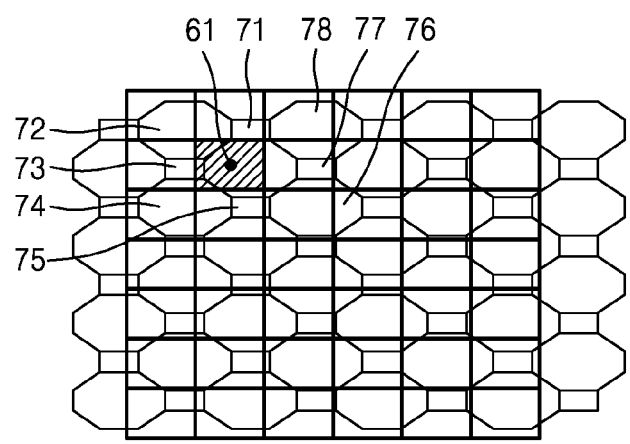

FIGS. 8A and 8B are diagrams illustrating an example method of obtaining a second image mapped to the first image using, for example, the image mapper 140.

For example, the image mapper 140 may receive a first image obtained from the first camera module 110 having a first pixel structure and a second image obtained from the second camera module 120 having a second pixel structure different from the first pixel structure. In order to obtain a third image having improved image quality using the first image obtained from the first camera module 110 having a first pixel structure and the second image obtained from the second camera module 120 having a second pixel structure, the image mapper 140 maps, for example, a pixel size and a pixel shape or a resolution between the first and second images having different pixel structures. For example, the image mapper 140 determines a pixel value of the second image at a position corresponding to each pixel of the first image obtained from the first pixel structure.

FIG. 8A is a diagram illustrating an example first pixel structure, and FIG. 8B is a diagram illustrating an example method of obtaining a mapped second image from a second pixel structure. Referring to FIG. 8A, pixels of the first pixel structure of FIG. 8A are, for example, all rectangular and have the same size. According to an example embodiment, a pixel value of a mapped second image may be obtained using pixels of the second image adjacent to a position corresponding to a center of each pixel of the first pixel structure.

For example, referring to FIG. 8B, a position in the second pixel structure corresponding to a pixel center 61 at (2,2) of the first pixel structure is illustrated. According to an example embodiment, a value obtained by linearly combining a pixel of the second pixel structure corresponding to the pixel center 61 and pixels 72 through 78 adjacent to this pixel may be set as a pixel value at (2, 2) of the second pixel structure corresponding to the pixel value at (2, 2) of the first pixel structure.

According to an example embodiment, when linearly combining a pixel of a second pixel structure corresponding to a pixel center in a first pixel structure and a center pixel and adjacent pixels of the second pixel structure, different weights may be applied to the linear combination by considering a distance between centers of respective pixels, an angle of each pixel, and whether the pixel in the second pixel structure corresponding to the pixel center and the adjacent pixels have the same size or shape. According to another example embodiment, a value obtained by non-linearly combining a pixel of a second pixel structure corresponding to a pixel center and adjacent pixels thereto may be set as a pixel value at (2,2) of the second pixel structure corresponding to a pixel value at (2, 2) of a first pixel structure.

Figure 9:
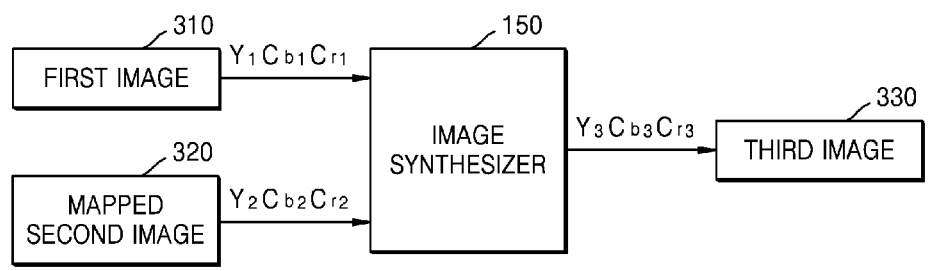
FIG. 9 is a block diagram illustrating an example method of synthesizing a third image.

FIG. 9 is a block diagram illustrating an example method of synthesizing a third image using, for example, the image synthesizer 150.

Referring to FIG. 9, the image synthesizer 150 receives $Y_1Cb_1Cr_1$ information from a first image 310 and $Y_2Cb_2Cr_2$ information from a mapped second image 320, from the image mapper 140. The first image 310 is obtained from a first camera module, and the mapped second image 320 is obtained by mapping a second image obtained from a second camera module, to the first image. According to an example embodiment, RGB information may be transmitted to the image synthesizer 150 instead of Y, Cb, Cr information, and the example embodiments are not limited thereto.

According to an example embodiment, the first camera module may be a color camera module, and the second camera module may be a monochromatic camera module. In this example, the first image 310 obtained from the color camera module may be a color image, and the mapped second image 320 obtained from the monochromatic camera module may be a monochromatic image, and Cb and Cr information of the mapped second image 320 may be ignored. According to another example embodiment, the first camera module may be a monochromatic camera module, and the second camera module may be a color camera module. In this example, the first image 310 obtained from the monochromatic camera module may be a monochromatic image, and the mapped second image 320 obtained from the color camera module may be a color image, and Cb and Cr information of the first image 310 may be ignored.

The image synthesizer 150 determines $Y_3Cb_3Cr_3$ information of a third image 330 using the first image 310 and the mapped second image 320. According to an example embodiment, the image synthesizer 150 may determine $Y_3Cb_3Cr_3$ information of a third image 330 by using, for example parallax information between the first image 310 and the mapped second image 320 with respect to a same subject. Parallax information may refer, for example, to a difference in view points of a left view image and a right view image with respect to a same subject. Parallax information with respect to a same subject between the first image 310 and the mapped second image 320 according to an example embodiment may, for example, be at least one of disparity, occlusion, and monocular cues information.

According to an example embodiment, when synthesizing a third image by synthesizing a first image which is a color image and a second image which is a monochromatic image, the image synthesizer 150 may select either a color image or a monochromatic image as a reference image using parallax information.

When a color image is used as a reference image, color information is maintained, and thus, color reproduction is secured but detailed information of portions of a monochromatic image may be lost. When a monochromatic image is used as a reference image, improvement of an SNR at the monochromatic level may be secured, but color information corresponding to each mono view needs to be additionally generated, and thus color reproduction of an occlusion region may become difficult. As described above, using a color image or a monochromatic image as a reference image each has advantages and disadvantages.

The image synthesizer 150 according to an example embodiment may use a two-track synthesis method in order to have advantages of image synthesis based a color image as a reference and image synthesis based on a monochromatic image as a reference image. For example, instead of presetting a reference image to be a color image or a monochromatic image, the image synthesizer 150 may determine the reference image based on parallax information. An operation of the image synthesizer 150 to select a color image or a monochromatic image as a reference image for image synthesis will be described in greater detail below with reference to FIGS. 10 and 11.

Figure 10:
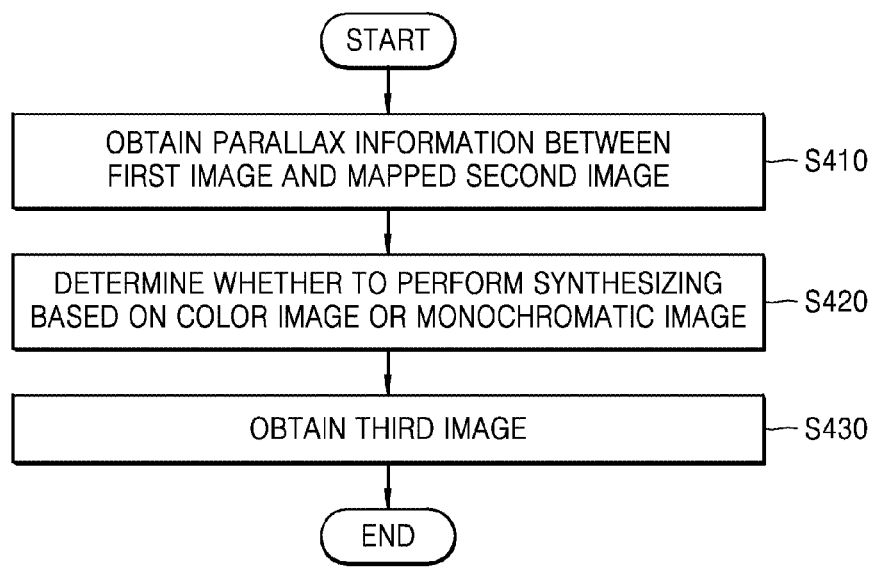
FIGS. 10 and 11 are flowcharts illustrating example methods of operating an image synthesizer.
Figure 11:
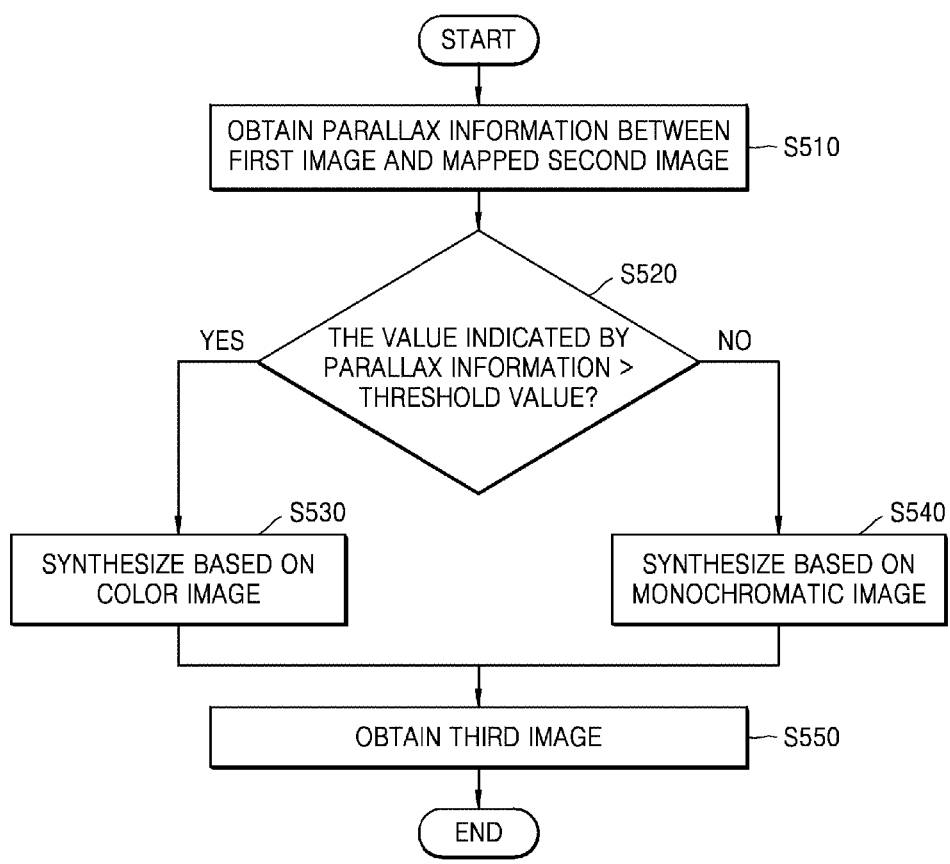

FIGS. 10 and 11 are flowcharts illustrating example methods of operating an image synthesizer.

Referring to FIG. 10, in operation S410, parallax information between a first image and a mapped second image is obtained. Parallax information may, for example, be at least one of disparity, occlusion, and monocular cues information.

According to an example embodiment, a first camera module may be a color camera module, and a second camera module may be a monochromatic camera module.

In operation S420, whether to synthesize an image based on a color image or a monochromatic image is determined based on parallax information. When a single image sensor is used, a color image may provide color information compared to when a monochromatic image is used as a reference image, and a monochromatic image which absorbs a greater amount of light may provide detailed information compared to when a color image is used as a reference image.

When a third image is synthesized based on a color image, color information may be maintained without change, and thus color reproduction of the color image is secured, and also improved detail information of a monochromatic image may be obtained. When a third image is synthesized based on a monochromatic image, detail information of the monochromatic image may be maintained without change, and thus a resolution and a SNR of the monochromatic image may be secured, and also, color information of a color image may be used.

The third image is obtained in operation S430 based on the image determined in operation S420 as a reference image.

FIG. 11 is a flowchart illustrating an example operation of an image synthesizer based on a value of parallax information.

In operation S510, parallax information of a first image and a mapped second image are obtained.

According to an example embodiment, the parallax information is compared with a predetermined threshold value in operation S520. When the value indicated by the parallax information is greater than the threshold value, a third image is synthesized based on a color image in operation S530, and when the value indicated by the parallax information is not greater than the threshold value, a third image is synthesized based on a monochromatic image in operation S540. While color information is obtained only from a color image, detail information is obtained both from a color image and a monochromatic image. Thus, when a value indicated by parallax information is greater than a threshold value, a third image may be synthesized based on a color image to provide stable color reproduction.

In operation S550, a third image is obtained based on an image determined in operation S530 or S540 as a reference image.

Figure 12:
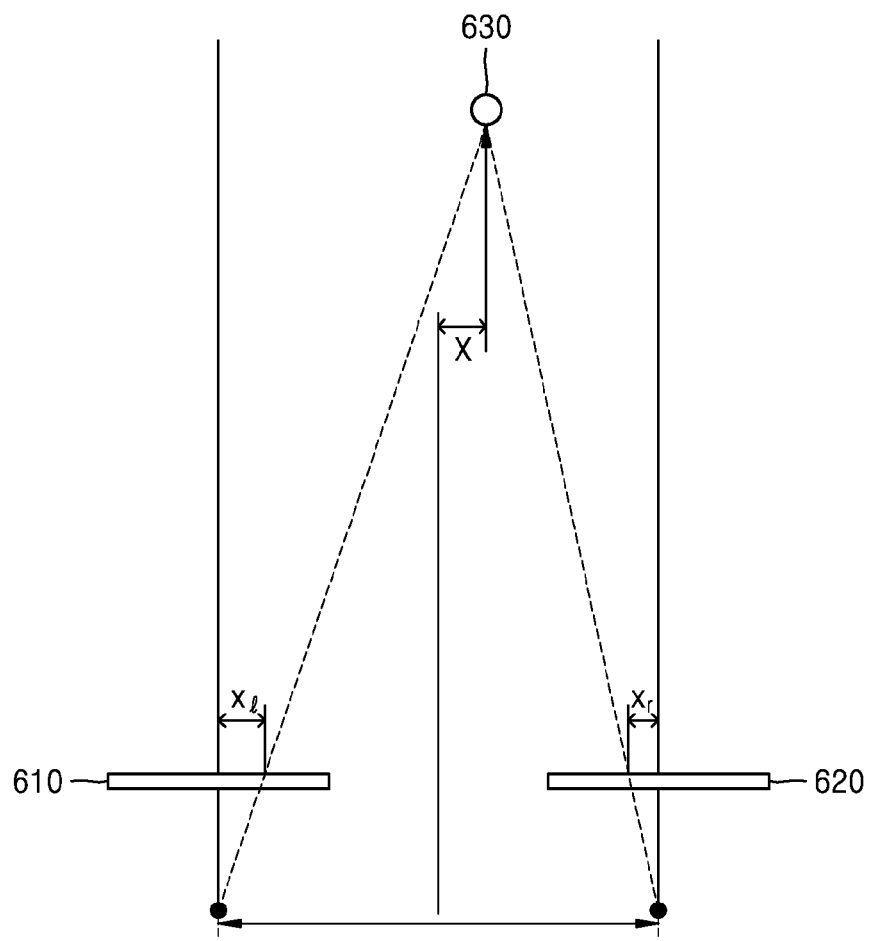
FIG. 12 is a diagram illustrating an example method of using disparity to obtain parallax information, performed by an image synthesizer.
Figure 13:
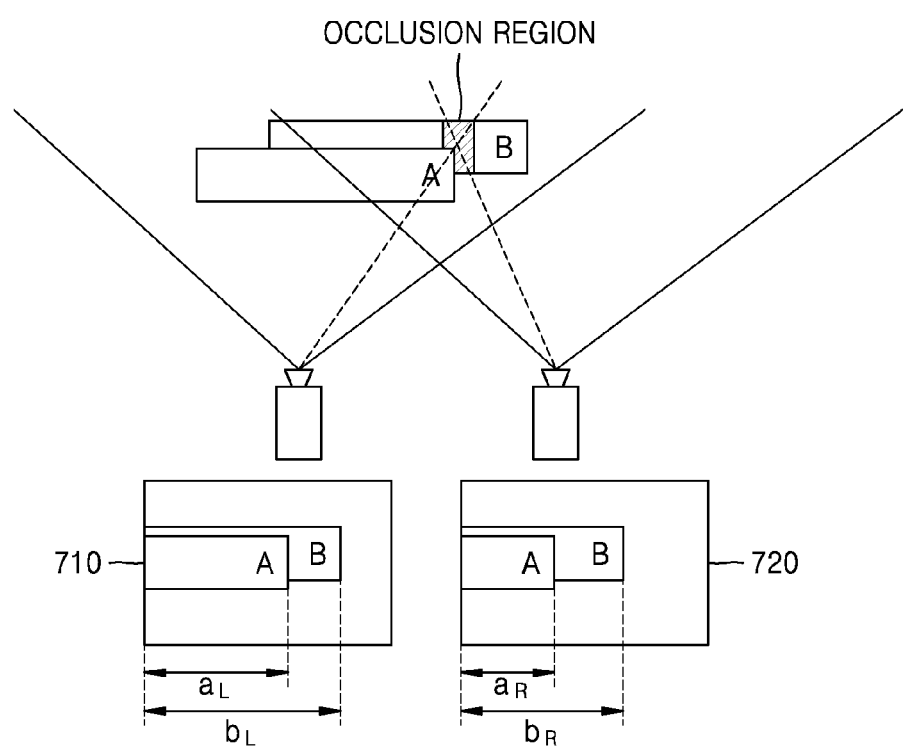
FIG. 13 is a diagram illustrating an example method of using occlusion to obtain parallax information, performed by an image synthesizer.

FIG. 12 is a diagram illustrating an example method of using disparity to obtain parallax information, performed by an image synthesizer. FIG. 13 is a diagram illustrating an example method of using occlusion to obtain parallax information, performed by an image synthesizer.

Referring to FIG. 12, a first image 610 is obtained from a first camera module, and a second image 620 is obtained by mapping a second image obtained from a second camera module, with the first image 610. Even though the first and second camera modules have identical optical characteristics, due to different positions of the first and second camera modules, positions of subjects in the first image 610 and the mapped second image 620 are different. According to an example embodiment, when $x_l$ is a location of a subject 630 in a left view image, and $x_r$ is a location of the subject 630 in a right view image, parallax information therebetween may be obtained by determining a difference between the two positions and applying a weight to the difference.

Referring to FIG. 13, a first image 710 is obtained from a first camera module, and a second image 720 is obtained by mapping a second image obtained from a second camera module, with the first image 710. A multi-camera system may include the first camera module and the second camera module, and in this example, the first camera module and the second camera module may be spaced apart from each other by a predetermined distance. When images of a subject A and a subject B are captured using the first camera module and the second camera module, an occlusion region, from which a portion of the image of the subject B is excluded, may be generated in the first image 710 unlike in the second image 720 obtained from the second camera module. According to an example embodiment, when $a_L$ denotes a location of the subject A in a left view image, $a_R$ denotes a location of the subject A in a right view image, $b_L$ denotes a location of the subject B in a left view image, $b_R$ denotes a location of the subject B in a right view image, parallax information may be obtained by determining a difference between the locations $a_L$ and $a_R$ and a difference between the locations $b_L$ and $b_R$ and applying a weight to each of the differences.

Figure 14:
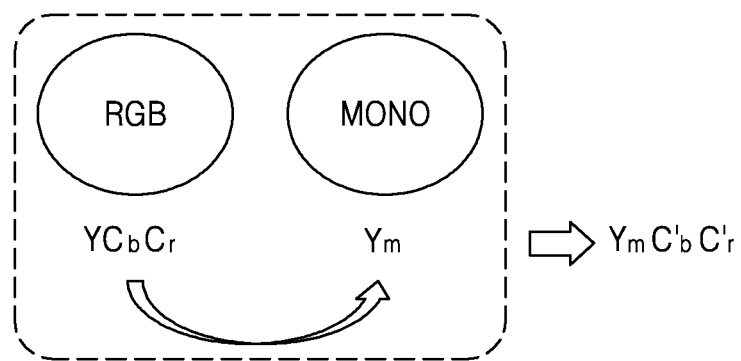
FIG. 14 is a diagram illustrating an example method of synthesizing a third image based on a monochromatic image.
Figure 15:
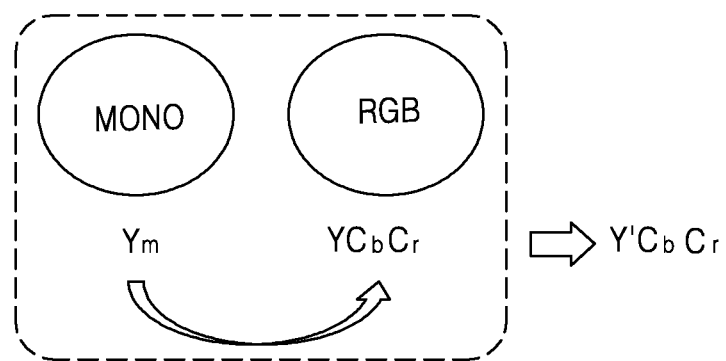
FIG. 15 is a diagram illustrating an example method of synthesizing a third image based on a color image.

FIG. 14 is a diagram illustrating an example method of synthesizing a third image based on a monochromatic image. FIG. 15 is a diagram illustrating an example method of synthesizing a third image based on a color image.

Referring to FIG. 14, according to an example embodiment, when a parallax between a first image and a mapped second image is equal to or less than a predetermined threshold, a third image may be synthesized based on an image obtained from a monochromatic camera module (referred to in this example and in FIGS. 14 and 15 as "mono"). In this example, a Y value obtained from the monochromatic camera module may be used as a Y value of the third image, and a sum value of Cb and Cr values and a value obtained by compensating for a parallax between the monochromatic camera module and a color camera module may be used as Cb and Cr values of the third image.

Referring to FIG. 15, according to another example embodiment, when a parallax between a first image and a mapped second image is equal to or greater than a predetermined threshold, a third image may be synthesized based on an image obtained from a color camera module. In this example, a sum value of a Y value obtained from a monochromatic camera module and a value obtained by compensating for a parallax between a mono camera module and the color camera module may be used as a Y value of the third image, and Cb and Cr values obtained from the color camera module may be used as Cb and Cr values of the third image.

Figure 16:
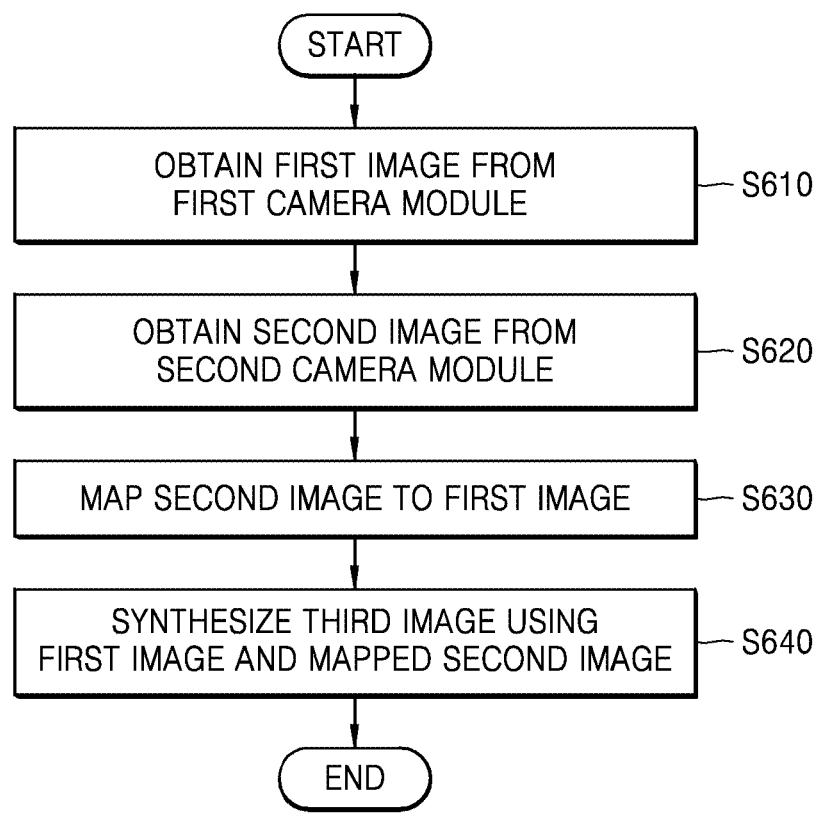
FIG. 16 is a flowchart illustrating an example method of operating an image capturing apparatus.

FIG. 16 is a flowchart illustrating an example method of operating an image capturing apparatus.

In operation S610, a first image of a subject captured using a first camera module is obtained from the first camera module.

In operation S620, a second image of the subject above captured using a second camera module is obtained from the second camera module.

An image sensor included in the first camera module may, for example, have a first pixel structure in which a pixel has only a rectangular shape, and an image sensor included in the second camera module may, for example, have a second pixel structure that is different from the first pixel structure.

In operation S630, the second image obtained from the second camera module may be mapped to the first image obtained from the first camera module. An example mapping process is described above with reference to FIG. 5, and thus description thereof will not be repeated here.

In operation S640, a third image may be synthesized using the first image and the mapped second image. An example synthesizing process is described above with reference to FIG. 6, and thus description thereof will not be repeated here.

The method of displaying an image according to the example embodiments set forth herein may be embodied as program instructions that can be executed by various computing units and recorded on a non-transitory computer-readable recording medium. Examples of the non-transitory computer-readable recording medium may include program instructions, data files, and data structures solely or in combination. The program instructions recorded on the non-transitory computer-readable recording medium may be specifically designed and configured for the inventive concept, or may be well known to and usable by one of ordinary skill in the field of computer software. Examples of the non-transitory computer-readable recording medium may include magnetic media (e.g., a hard disk, a floppy disk, a magnetic tape, etc.), optical media (e.g., a compact disc-read-only memory (CD-ROM), a digital versatile disk (DVD), etc.), magneto-optical media (e.g., a floptical disk, etc.), and a hardware device specially configured to store and execute program instructions (e.g., a read only memory (ROM), a random access memory (RAM), a flash memory, etc.). Examples of the program instructions may include not only machine language codes prepared by a compiler but also high-level codes executable by a computer by using an interpreter.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. An image capturing apparatus comprising:
a first camera module comprising a first image sensor and a second camera module comprising a second image sensor, the first and second camera modules configured to capture an image of a same subject; and
a controller configured to map a second image obtained from the second camera module to a first image obtained from the first camera module, and to synthesize a third image of the subject using the first image and the mapped second image,
wherein the first image sensor included in the first camera module has a first pixel structure in which each pixel has a square shape, and the second image sensor included in the second camera module has a second pixel structure that is different from the first pixel structure.

2. The image capturing apparatus of claim 1, wherein one of the first and second camera modules comprises a color camera module, and the other of the first and second camera modules comprises a monochromatic camera module.

3. The image capturing apparatus of claim 1, wherein the second pixel structure includes a plurality of pixel structures, and a first region of the second pixel structure and a second region of the second pixel structure have at least one of a size and a shape that are different from each other.

4. The image capturing apparatus of claim 2, wherein the controller is configured to select an image obtained from the color camera module or an image obtained from the monochromatic camera module as a reference image for image synthesis based on parallax information between the first image and the mapped second image.

5. The image capturing apparatus of claim 4, wherein the controller is configured to determine whether a value of the parallax information is greater than a threshold value, and
when the value of the parallax information is greater than the threshold value, an image obtained from the color camera module is determined as the reference image for image synthesis, and
when the value of the parallax information is not greater than the threshold value, an image obtained from the monochromatic camera module is determined as the reference image for image synthesis.

6. The image capturing apparatus of claim 4, wherein the parallax information comprises at least one of: disparity information and occlusion information of the first image and the mapped second image.

7. A method of operating an image capturing apparatus, comprising:
obtaining a first image of a subject from a first camera module and a second image of the subject from a second camera module;
mapping the second image to the first image; and
synthesizing a third image of the subject using the first image and the mapped second image,
wherein an image sensor included in the first camera module has a first pixel structure in which a pixel has a square shape, and an image sensor included in the second camera module has a second pixel structure that is different from the first pixel structure.

8. The method of claim 7, wherein one of the first and second camera modules is a color camera module, and the other of the first and second camera modules is a monochromatic camera module.

9. The method of claim 7, wherein the second pixel structure includes a plurality of pixel structures, and a first region of the second pixel structure and a second region of the second pixel structure have at least one of a size and a shape that are different from each other.

10. The method of claim 8, wherein the synthesizing of the third image of the subject comprises selecting, based on parallax information between the first image and the mapped second image, an image obtained from the color camera module or an image obtained from the monochromatic camera module, as a reference image for image synthesis.

11. The method of claim 10, wherein the synthesizing of the third image of the subject comprises determining whether the value of the parallax information is greater than a threshold value,
wherein when the value of the parallax information is greater than the threshold value, an image obtained from the color camera module is determined as the reference image for image synthesis, and
when the value of the parallax information is not greater than the threshold value, an image obtained from the monochromatic camera module is determined as the reference image for image synthesis.

12. The method of claim 10, wherein the parallax information comprises at least one of: disparity information and occlusion information of the first image and the mapped second image.

13. A non-transitory computer readable medium having embodied thereon a program which, when executed operates the image capturing apparatus to perform the method of claim 7.

* * * * *